(12) United States Patent
Jang (10) Patent No.: US 6,495,478 B1
(45) Date of Patent: Dec. 17, 2002

(54) REDUCTION OF SHRINKAGE OF POLY (ARYLENE ETHER) FOR LOW-K IMD

(75) Inventor: Syun-Ming Jang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/336,801

(22) Filed: Jun. 21, 1999

(51) Int. Cl.[7] .............................................. H01L 21/469
(52) U.S. Cl. ......................... 438/781; 438/624; 438/637
(58) Field of Search ................................ 438/781, 637, 438/763, 624, 623, FOR 355, FOR 395

(56) References Cited

U.S. PATENT DOCUMENTS

| | | | |
|---|---|---|---|
| 4,920,005 A | 4/1990 | Mercer | 428/411.1 |
| 5,593,720 A | 1/1997 | Ahn et al. | 427/97 |
| 5,759,906 A | * 6/1998 | Lou | |
| 6,080,526 A | * 6/2000 | Yang et al. | |

FOREIGN PATENT DOCUMENTS

JP           6-244291      *  9/1994

* cited by examiner

Primary Examiner—Wael Fahmy
Assistant Examiner—Thanh V Pham
(74) Attorney, Agent, or Firm—George O. Saile; Stephen B. AcKerman (57) ABSTRACT

A method for forming upon a substrate employed within a microelectronics fabrication a dielectric layer. There is provided a substrate upon which is formed a patterned microelectronics layer. There is then formed upon and over the substrate at least one low dielectric constant dielectric layer formed employing a spin-on-polymer (SOP) low dielectric constant dielectric material. There is then cured the low dielectric constant dielectric layer at an elevated temperature. There is then subsequently annealed the low dielectric constant dielectric layer at a temperature selected to be lower than the curing temperature For a selected time interval so as to attenuate shrinkage and stabilize physical and chemical properties of the dielectric layer 9 Claims, 3 Drawing Sheets

REDUCTION OF SHRINKAGE OF POLY (ARYLENE ETHER) FOR LOW-K IMD

BACKGROUND OF THE INVENTION

1. Field of the Invention

This invention relates to the field of dielectric layers employed within microelectronics fabrications. More particularly, this invention relates to the formation of dielectric layers disposed among inter-level metallization and conductive layers within microelectronics fabrications.

2. Description of the Related Art

The manufacture of microelectronics fabrications makes use of conductor and semiconductor layers formed and patterned upon substrates to form electrical circuits. It is necessary to separate these electrically conducting layers from each other by insulating layers of dielectric material. In addition to being non-conductors of electricity, these dielectric layers must be capable of being formed to exacting physical specifications and must be able to withstand subsequent microelectronics fabrication operations and device operating conditions. Of particular importance is the ability to function satisfactorily over a wide range of temperature.

Advances in speed and performance requirements, along with decreases in dimensions and ground rules for microelectronics devices, have made the requirements placed upon such dielectric layers more stringent with respect to lowering the "relative dielectric constant" of the dielectric layers i.e. the dielectric constant relative to vacuum, hereinafter referred to for brevity as the dielectric constant). Lower dielectric constant dielectric layers are desirable disposed between and around the patterned microelectronics conductor layers within microelectronics fabrications since such lower dielectric constant dielectric layers typically provide microelectronics fabrications with reduced parasitic capacitance and attenuated patterned conductor layer cross-talk Within the art of microelectronics fabrication, it is conventional to employ dielectric layers formed from silicon containing dielectric materials. Silicon containing dielectric materials including but not limited to silicon oxide dielectric materials, silicon nitride dielectric materials and silicon oxynitride dielectric layers formed between and around patterned microelectronics conductor layers within microelectronics fabrications are generally satisfactory. However, such dielectric materials typically exhibit dielectric constant values which range from about 4.0 to about 9.0 when formed into dielectric layers formed between and around patterned conductor layers, and it is therefore desirable to employ alternate methods and materials for forming dielectric layers having lower dielectric constants.

Of the methods and materials which may be employed for forming lower dielectric constant dielectric constant dielectric layers disposed between and around the patterns of patterned microelectronics conductor layers within microelectronics fabrications, methods which employ dielectric materials with intrinsically low dielectric constants are particularly desirable within the art of microelectronics fabrication. Such alternative low dielectric constant dielectric layers may be formed on microelectronics substrates by spin coating of intrinsically low dielectric constant materials including but not limited to organic polymer spin-on-polymer (SOP) dielectric materials. Such dielectric layers typically exhibit somewhat lower dielectric constants than those of silicon containing dielectric materials, ranging from about 2.5 to about 3.0. In particular, organic polymer spin-on-polymer (SOP) dielectric materials which may be employed for forming dielectric layers include but are not limited to polyimide organic polymer dielectric materials, poly (arylene ether) organic polymer dielectric materials and fluorinated poly (arylene ether) organic polymer dielectric materials. Such organic polymer spin-on-polymer (SOP) dielectric materials are typically thermally cured after spin coating in order Lo form stable dielectric layers from the spin-on-polymer (SOP) dielectric materials. The thermal curing process is generally regarded as necessary to accomplish the removal of solvents, plasticizers and related substances from the organic polymer dielectric layer, as well as to insure the proper degree of polymerization within the organic polymer dielectric layer.

The magnitude of the dielectric constant as well as the stability of the physical and chemical properties of the spin-on-polymer dielectric layer are largely determined by the degree of polymerization of the organic polymer and the amount of residual material remaining within the organic polymer dielectric layer. Hence conventional curing methods after forming organic polymer spin-on-polymer (SOP) dielectric layers employed in the art of microelectronics fabrication by spin coating generally employ thermal annealing at elevated temperatures and may also employ specified environmental conditions during the curing process.

Particularly suited to use between multiple interconnection conductor patterns as inter-level metallization dielectric (IMD) layers are organic polymer dielectric materials. Such organic polymer materials as, for example, the poly (arylene ether) thermoplastic polymers possess outstanding dielectric properties such as low dielectric constant and high breakdown voltage, and are readily formed into dielectric layers employing spin-on-polymer (SOP) coating methods. With appropriate curing, such organic polymers may be employed in conventional microelectronics fabrications wherein resistance to thermal and environmental stresses is a significant requirement.

The application of organic polymer dielectric layers as dielectric layers disposed around and between conductor layers as inter-level metallization dielectric (IMD) layers is not without its problems. The organic polymer dielectric layer must be properly cured to avoid physical or dielectric degradation such as shrinkage and other problems due to subsequent thermal excursions after formation and curing of the dielectric layer. In applications where there is contact with other organic chemicals and solvents, as in photolithography and cleaning processes as are conventionally employed in the art of microelectronics fabrication, the stability of the dielectric layer must be sufficient to withstand such exposure.

Although desirable for having relatively lower dielectric constant values, spin-on-polymer (SOP) dilectric materials which are employed for forming spin-on-polymer (SOP) dielectric layers in microelectronics fabrications are not without additional problems. In particular, curing of spin-on-polymer (SOP) dielectric layers by thermal annealing at an elevated temperature after conventional spin coating often results in incomplete or non-uniform stability of the resulting cured dielectric layer, particularly with respect to subsequent changes in physical or in chemical properties when the dielectric layer is exposed to additional thermal stresses and/or environmental conditions analogous to the curing conditions during operation of the device.

It is therefore towards the goal of forming within microelectronics fabrications low dielectric constant dielectric layers formed from spin-on-polymer (SOP) dielectric materials, while forming the low dielectric constant dielectric layers with attenuated shrinkage and stabilized physical and chemical properties, that the present invention is more generally directed.

Various methods and materials and associated microelectronics structures have been disclosed within the art of microelectronics fabrication for forming between and around patterned microelectronics conductor layers within microelectronics fabrications low dielectric constant dielectric layers.

For example, Mercer, in U.S. Pat. No. 4,920,005, discloses a composition of two organic polymers which upon mixing cure to form a dielectric layer useful as electrical insulation between and around conductive or semiconductive layers. One of the components is an aromatic polymer with a preponderance of a single repeat unit, and the other component is a compatible reactive material such as an acetylene, maleimide, vinyl-terminated polyimide or precursor thereof Further, Ahn et al., in U.S. Pat. No. 5,593,720, disclose a method for forming a multilevel electronic package structure comprising at least two levels of dielectric layers and conductive vias. The dielectric layers are formed from a first layer of poly(aryl ether benzimidazole) upon which is coated a second layer of polyamic acid, the two layers reacting to form a product layer which is then thermally cured to form a polyimide dielectric layer through which conductive copper through vias are formed.

Finally, Lou, in U.S. Pat. No. 5,759,906, discloses a method for forming a planar dielectric layer upon a patterned conductor layer upon a substrate to provide multilevel electrical interconnections. The method employs either spin-on-glass (SOG) or spin-on-polymer (SOP) dielectric materials in a multi-step process wherein the dielectric layer is built of at least four separate coating and baking cycles to form the completed dielectric layer. The dielectric layers are thermally cured after formation by electron beam heating.

Desirable in the art of microelectronics fabrication are additional methods and materials which may be employed for forming a dielectric layer with a relatively low dielectric constant disposed between and around patterned microelectronics conductor layers within a microelectronics fabrication, where the low dielectric constant dielectric layer is cured so as to be able to undergo subsequent thermal excursions with attenuated shrinkage and with stabilized physical and chemical properties.

It is towards the foregoing goals that the present invention is both generally and more specifically directed.

SUMMARY OF THE INVENTION

A first object of the present invention is to provide a method for forming upon a substrate within a microelectronics fabrication a dielectric layer.

A second object of the present invention is to provide a method in accord with the first object of the present invention, where there is formed disposed between and around a patterned microelectronics conductor layer upon the substrate employed within the microelectronics fabrication a low dielectric constant dielectric layer with attenuated shrinkage and stabilized physical and chemical properties.

A third object of the present invention is to provide a method in accord with the first object of the present invention or the second object of the present invention, where there is formed disposed between and around the patterned microelectronics conductor layer within a semiconductor substrate employed within an integrated circuit microelectronics fabrication at least one low dielectric constant dielectric layer formed employing organic polymer low dielectric constant spin-on-polymer (SOP) dielectric material which is subsequently cured to achieve attenuated shrinkage and stabilized physical and chemical properties.

A fourth object of the present invention is to provide a method in accord with the first object of the present invention, the second object of the present invention and/or the third object of the present invention, where the method is readily commercially implemented.

In accord with the objects of the present invention, there is provided by the present invention a method for forming from an organic polymer spin-on-polymer (SOP) dielectric material upon a substrate within a microelectronics fabrication a low dielectric constant dielectric layer. To practice the method of the present invention, there is first provided a substrate. There is formed upon the substrate a patterned microelectronics layer. There is then formed disposed between and around the patterns of the patterned microelectronics layer a dielectric layer formed employing an organic polymer low dielectric constant spin-on-polymer (SOP) dielectric thermally shrinkable material. There is then annealed for a first time interval the low dielectric constant dielectric layer at an elevated temperature. There is then annealed the low dielectric constant dielectric layer for a second time interval at a selected temperature lower than the first annealing temperature so that the shrinkage of the dielectric layer is attenuated and physical and chemical properties are stabilized with respect to subsequent thermal and environmental excursions.

The present invention provides a method for forming upon a substrate employed within a microelectronics fabrication a low dielectric constant dielectric layer employing an organic polymer spin-on-polymer (SOP) dielectric thermally shrinkable material. The formation and first annealing of the dielectric layer is followed by a second annealing step at selected temperatures for selected times to attenuate shrinkage and stabilize the physical and chemical properties of the dielectric layer.

The method of the present invention employs methods and materials as are generally known in the art of microelectronics fabrication. Since it is a novel ordering of methods, materials and process limits which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a method for forming upon a substrate employed within a microelectronics fabrication a dielectric layer formed employing a low dielectric constant spin-on-polymer (SOP) dielectric thermally shrinkable material which is then first thermally annealed or "cured" and then thermally annealed a second time to attenuate shrinkage and stabilize physical and chemical properties.

The present invention provides a method for forming a low dielectric constant dielectric layer upon a substrate employed within a microelectronics fabrication employing a low dielectric constant spin-on-polymer (SOP) thermally shrinkable dielectric material. The dielectric layer is first thermally annealed or "cured" and subsequently thermally annealed a second time at a lower temperature than the first annealing temperature for a selected time interval to attenuate shrinkage and stabilize physical and chemical properties. The method of the present invention may be practiced in microelectronics fabrications including but not limited to integrated circuit microelectronics fabrications, charge coupled device microelectronics fabrications, solar cell microelectronics fabrications, ceramics substrate microelectronics fabrications and flat panel display microelectronics fabrications.

Although the preferred embodiments of the present invention illustrate the method of the invention employing spin-on-polymer (SOP) low dielectric constant dielectric material to form the low dielectric constant dielectric layers, alternatively other low dielectric constant dielectric materials including but not limited to spin-on-glass (SOG) materials and heat shrinkable polymer materials may also be employed to form the low dielectric constant dielectric layer of the invention.

First Preferred Embodiment

Figure 1:
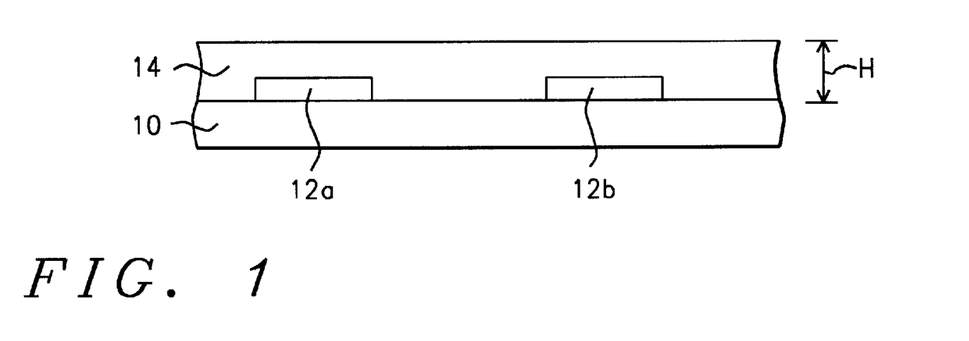
FIG. 1, FIG. 2 and FIG. 3 are directed towards a general embodiment of the present invention which constitutes a first preferred embodiment of the present invention. Shown in FIG. 1 to FIG. 3 is a series of schematic cross-sectional diagrams illustrating the results of forming upon a substrate employed within a microelectronics fabrication a low dielectric constant dielectric layer employing a spin-on-polymer (SOP) low dielectric constant dielectric thermally shrinkable material which is subsequently first thermally annealed at an elevated temperature and then thermally annealed a second time for a selected time interval at a lower temperature than the first thermal annealing to attenuate shrinkage and stabilize the physical and chemical properties of the dielectric layer, in accord with the first preferred embodiment of the present invention.
Figure 2:
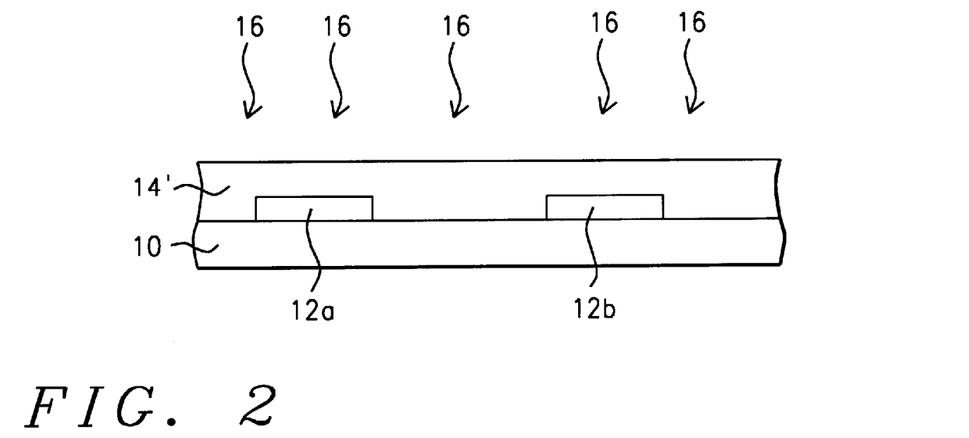
Figure 3:
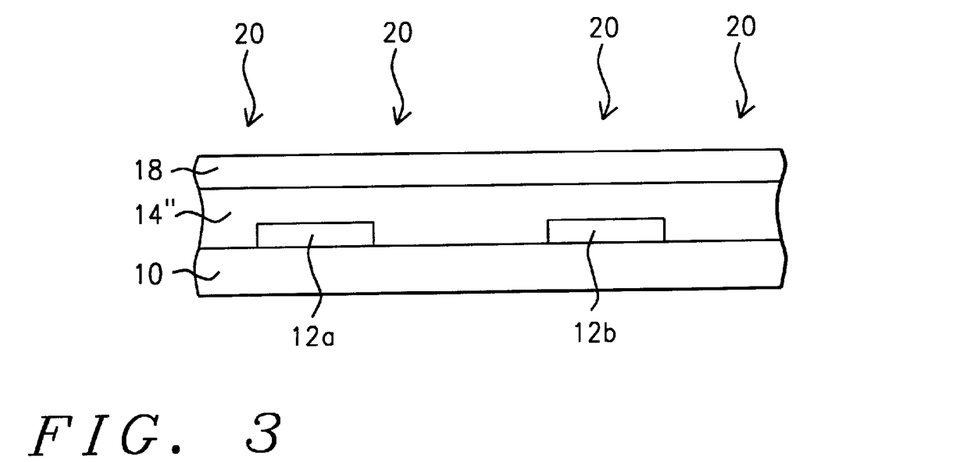

Referring now to FIG. 1 to FIG. 3, there is shown a series of schematic cross-sectional diagrams illustrating the results of forming upon a substrate employed within a microelectronics fabrication, in accord with a general embodiment of the present invention which constitutes a first preferred embodiment of the present invention, a dielectric layer formed employing a spin-on-polymer (SOP) low dielectric constant dielectric thermally shrinkable material which is first thermally annealed or "cured" and subsequently thermally annealed a second time at a selected temperature lower than the first annealing temperature for a selected time interval, to attenuate shrinkage and stabilize physical and chemical properties. FIG. 1 is a schematic cross-sectional diagram of a microelectronics fabrication at an early stage in its manufacture in accord with the first preferred embodiment of the present invention,.

Shown in FIG. 1 is a substrate 10 employed within a microelectronics fabrication, where the substrate 10 has formed upon it a series of patterned microelectronics layers 12a and 12b. Formed over and around the patterned microelectronics layer is a blanket low dielectric constant dielectric layer 14. The blanket low dielectric constant dielectric layer 14 is formed to a thickness H over the substrate 10.

Within the first preferred embodiment of the present invention, the substrate 10 may be a substrate employed within a microelectronics fabrication selected from the group including but not limited to integrated circuit microelectronics fabrications, charge coupled device microelectronics fabrications, solar cell microelectronics fabrications, ceramic substrate microelectronics fabrications and flat panel display microelectronics fabrications. Although not specifically illustrated within the schematic cross-sectional diagram of FIG. 1, the substrate 10 may be the substrate itself employed within the microelectronics fabrication. Or in the alternative, the substrate 10 may be the substrate employed within the microelectronics fabrication, where the substrate has any of several additional microelectronics substrate layers formed thereupon or thereover. Such additional microelectronics substrate layers (similarly with the substrate 10 itself) may include, but are not limited to microelectronics conductor substrate layers, microelectronics semiconductor substrate layers and microelectronics dielectric substrate layers.

With respect to the series of patterned microelectronics layers 12a and 12b, the series of patterned microelectronics layers 12a and 12b may Be formed from a group including but not limited to microelectronics metal layers, microelectronics alloy layers, microelectronics metallic compound layers, microelectronics semiconductor layers and microelectronics dielectric layers. Methods for forming patterned microelectronics layers include but are not limited to thermal assisted evaporation methods, electron beam evaporation methods, chemical vapor deposition (CVD) methods and physical vapor deposition (PVD) sputtering methods.

Within the first preferred embodiment of the present invention, the series of patterned microelectronics layers 12a and 12b is preferably formed from aluminum containing material employing the method of thermal assisted evaporation.

With respect to the blanket low dielectric constant dielectric layer 14, the blanket low dielectric constant dielectric layer 14 may be formed from any of several low dielectric constant spin-on-polymer (SOP) dielectric materials as are known in the art of microelectronics fabrication, including but not limited to polyimide spin-on-polymer (SOP) dielectric material, poly(arylene ether) spin-on-polymer (SOP) dielectric material, fluorinated poly (arylene ether) spin-on-polymer (SOP) dielectric material and thermally shrinkable spin-on-polymer (SOP) dielectric material. Preferably, the blanket low dielectric constant dielectric layer 14 is formed employing a low dielectric constant poly(arylene ether) spin-on-polymer (SOP) material known as Flare 2.0, available commercially from Allied Signal Corporation, 1349 Moffett Park Drive, Sunnyvale, Calif. 94089. Alternatively, the poly(arylene ether) spin-on-polymer (SOP) dielectric material known as PAE-2.3 (Trademark Lo-K 2000) available from Schumacher Corporation, 1969 Palomar Oaks Way, Carlsbad, Calif. 92009, may be employed to form the blanket low dielectric constant dielectric layer 14. A further alternative poly(arylene ether) spin-on-polymer (SOP) dielectric material which may be employed to form the blanket low dielectric constant dielectric layer 14 is known as SILK-1, commercially available from Dow Chemical Co., 712 Building, Midland, Mich. 48674. Preferably, the blanket first dielectric layer is thermally annealed or "cured" at a temperature of from about 400 to about 450 degrees centigrade Referring now to FIG. 2, there is shown a schematic cross-sectional diagram illustrating the results of further processing of the microelectronics fabrication shown in FIG. 1. Shown in FIG. 2 is a schematic cross-sectional diagram of a microelectronics fabrication otherwise equivalent to the microelectronics fabrication shown in FIG. 1, but wherein the blanket low dielectric constant dielectric layer 14' is thermally annealed a second time in an environment 16 after first thermal annealing at 440 degrees centigrade With respect to the blanket low dielectric constant dielectric layer 14', the blanket low dielectric constant dielectric layer 14' has been annealed a second time at a lower temperature than the first thermal annealing temperature, and is therefore not substantially altered in its properties from the state of the annealed blanket low dielectric constant dielectric layer 14.

Referring now to FIG. 3, there is shown a schematic cross-sectional diagram illustrating the results of further processing of the microelectronics fabrication whose schematic cross-sectional diagram is shown in FIG. 2. Shown in FIG. 3 is a schematic cross-sectional diagram of a microelectronics fabrication otherwise equivalent to the microelectronics fabrication shown in FIG. 2, but wherein there has been formed a blanket microelectronics layer 18 over the microelectronics fabrication employing a processing environment 20 and form the blanket With respect to the microelectronics layer 18, the microelectronics layer 18 may be a layer formed from material known in the art of microelectronics fabrication, including but not limited to microelectronics conductor materials, microelectronics semiconductor materials and microelectronics dielectric materials formed by methods as are known in the art of microelectronics fabrication. Preferably, the materials and methods employed in forming microelectronics layer 18 are chosen to permit a processing condition 20 which includes exposure to temperature lower than the first annealing temperature of blanket low dielectric constant dielectric layer 14" for an appropriate time interval, normally about one hour.

With respect to the thermal annealing of the blanket low dielectric constant dielectric layer 14", the thermal annealing may be done at a lower temperature for a longer time interval to accomplish the same degree of stabilization. This accomplishment occurs if the time interval of thermal annealing is lengthened from about 10 to about 20 minutes in proportion for each lowering of the thermal annealing temperature of from about 10 to about 20 degrees centigrade.

Second Preferred Embodiment

Figure 4:
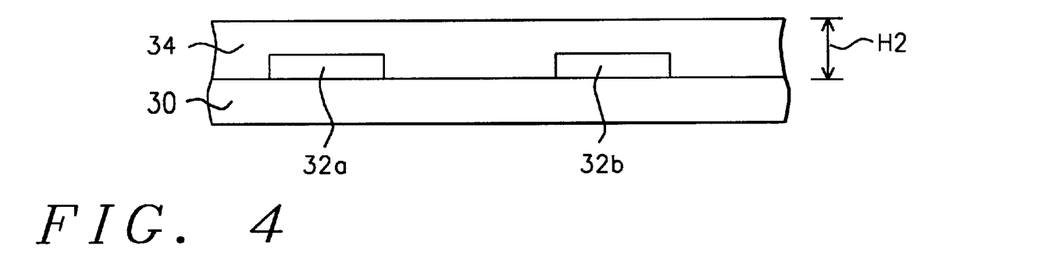
FIG. 4, FIG. 5, FIG. 6, FIG. 7 and FIG. 8 are directed towards a more specific embodiment of the present invention which constitutes a second preferred embodiment of the present invention. Shown in FIG. 4 to FIG. 8 is a series of schematic cross-sectional diagrams illustrating the results of forming upon a semiconductor substrate employed within an integrated circuit microelectronics fabrication an inter-level metallization dielectric (IMD) structure comprising two low dielectric constant dielectric layer employing a spin-on-polymer (SOP) low dielectric constant thermally shrinkable dielectric material. The low dielectric constant dielectric layers are first thermally annealed after formation at an elevated temperature and then thermally annealed a second time at a lower temperature than the first annealing temperature for a selected time interval to attenuate shrinkage and stabilize physical and chemical properties in accord with the second preferred embodiment of the present invention.

Referring now to FIG. 4 to FIG. 8, there is shown a series of schematic cross-sectional diagrams illustrating the results of forming, upon a substrate employed within a semiconductor integrated circuit microelectronics fabrication in accord with a more specific embodiment of the present invention which comprises a second preferred embodiment of the present invention a dielectric layer, a dielectric layer formed from a low dielectric constant spin-on-polymer (SOP) dielectric material which is first thermally annealed and subsequently annealed a second time at a selected temperature lower than the first thermal annealing temperature for a selected time interval to attenuate shrinkage and stabilize physical and chemical properties. FIG. 4 is a schematic cross-sectional diagram of a semiconductor integrated circuit microelectronics fabrication at an early stage in its fabrication in accord with the method of the preferred second embodiment of the present invention.

Shown in FIG. 4 is a semiconductor substrate 30 having formed within and upon its surface a series of patterned microelectronics layers 32a and 32b. Formed over and around the series of patterned microelectronics layers 32a and 32b is a blanket dielectric layer 34 formed employing a low dielectric constant spin-on-polymer (SOP) dielectric material. The blanket dielectric layer 34 is formed to a thickness H.

With respect to the semiconductor substrate 30 shown in FIG. 4, the semiconductor substrate 30 is analogous or equivalent to the substrate 10 shown in FIG. 1 of the first preferred embodiment of the present invention, Preferably, the semiconductor substrate 30 is a (100) silicon semiconductor substrate having P- or N-type doping.

With respect to the series of patterned microelectronics layers 32a and 32b shown in FIG. 4, the series of patterned microelectronics layers 32a and 32b is formed and patterned analogous or equivalent to the patterned microelectronics layers 12a and 12b shown in FIG. 1 of the first preferred embodiment of the method of the present invention.

With respect to the blanket dielectric layer 34 shown in FIG. 4, the blanket dielectric layer 34 is formed employing methods and materials equivalent or analogous to the methods and materials employed to form the blanket dielectric layer 14 shown in FIG. 1 of the first preferred embodiment of the method of the present invention. The blanket first dielectric layer 34 is formed to a thickness H2 equivalent or analogous to the thickness H of FIG. 1.

The semiconductor integrated circuit microelectronics fabrication shown in FIG. 4 may include integrated circuit devices as, for example, field effect transistor (FET) integrated circuit devices not shown in FIG. 4.

Figure 5:
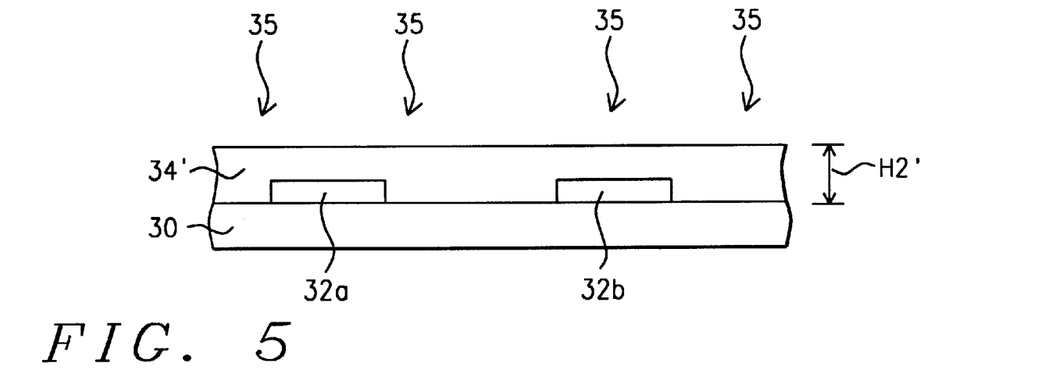

Referring now to FIG. 5, there is shown a schematic cross-sectional diagram illustrating the results of further processing of the microelectronics fabrication whose schematic cross-sectional diagram is shown in FIG. 4. Shown in FIG. 5 is a schematic cross-sectional diagram of a microelectronics fabrication otherwise equivalent to FIG. 4, but wherein there has been thermally annealed in an environment 35 after first thermally annealing the blanket dielectric layer 34'. The thermal annealing temperature and time interval have been selected analogous or equivalent to the thermal annealing and time interval conditions employed in FIG. 2 of the first preferred embodiment of the method of the present invention, after thermal annealing of the blanket dielectric layer 34' to thickness H2' equivalent or analogous to the first thermal annealing employed in FIG. 2 of the first preferred embodiment of the method of the present invention.

Figure 6:
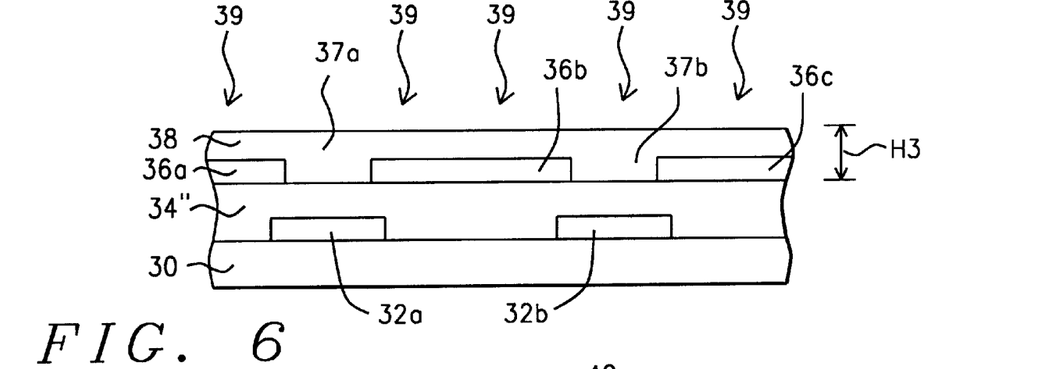

Referring now to FIG. 6, there is shown a schematic cross-sectional diagram illustrating the results of further processing of the microelectronics fabrication whose schematic cross-sectional diagram is shown in FIG. 5. Shown in FIG. 6 is a microelectronics fabrication otherwise equivalent to the microelectronics fabrication shown in FIG. 5, but wherein there has been formed a series of patterned microelectronics layers 36a, 36b and 36c over and upon the blanket dielectric layer 34'. The series of patterned microelectronics layers 36a, 36b and 36c form a microelectronics patterned layer with openings 37a and 37b positioned over the corresponding microelectronics pattern formed by the series of patterned microelectronics layers 32a and 32b. Formed over the series of patterned microelectronics layers 36a, 36b and 36c which comprise the microelectronics pattern having the openings 37a and 37b is a blanket dielectric layer 38'.

With respect to the series of patterned microelectronics layers 36a, 36b and 36c, the series of patterned microelectronics layers 36a, 36b and 36c comprises a masking layer to permit subsequent formation of openings by selective etching through the blanket dielectric layer 34'. Preferably, the series of patterned microelectronics layers 36a, 36b and 36c is formed employing a silicon nitride dielectric layer preferably formed by chemical vapor deposition (CVD) methods and photolithographic methods or pattern formation conventional in the art of microelectronics integrated circuits fabrication.

With respect to the blanket second dielectric layer 38, the blanket second dielectric layer 38 is formed employing a low dielectric constant spin-on-polymer (SOP) dielectric layer analogous or equivalent to the first blanket dielectric layer 34. The blanket second dielectric layer 38 is formed to a thickness of H3. The blanket second dielectric layer 38 is thermally annealed 39 at a temperature for a time interval analogous or equivalent to the thermally annealing temperature and time interval 20 of the blanket first dielectric layer shown in FIG. 3 of the preferred first embodiment of the method of the present invention.

Figure 7:
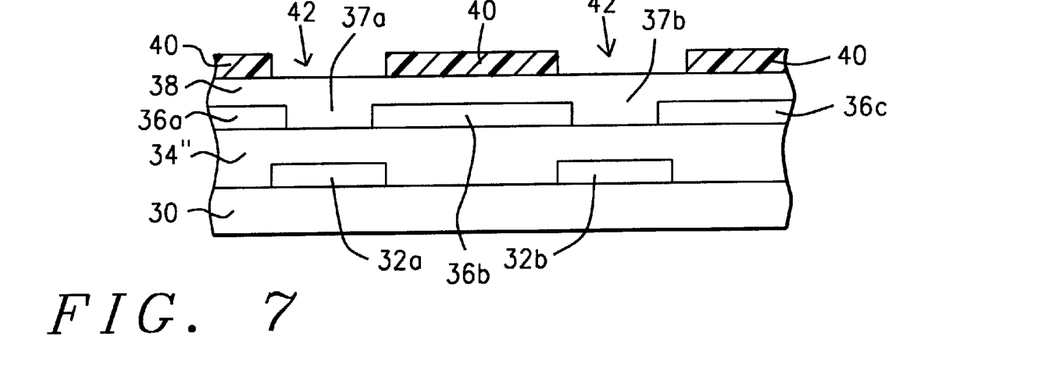

Referring now to FIG. 7, there is shown a schematic cross-sectional diagram illustrating the results of further processing of the microelectronics integrated circuit fabrication whose schematic cross-sectional diagram is shown in FIG. 6. Shown in FIG. 7 is a microelectronics integrated circuit fabrication otherwise equivalent to the microelectronics integrated circuit fabrication shown in FIG. 6, but wherein there has been formed a photoresist mask pattern 40 with patterned openings 42 corresponding to the patterned openings 37 and the series of patterned microelectronics layers 32a and 32b.

With respect to the photoresist mask pattern 40 and patterned openings 42, the photoresist pattern 40 with patterned openings 42 are formed employing methods and materials as are conventional in the art of microelectronics integrated circuit fabrication.

Figure 8:
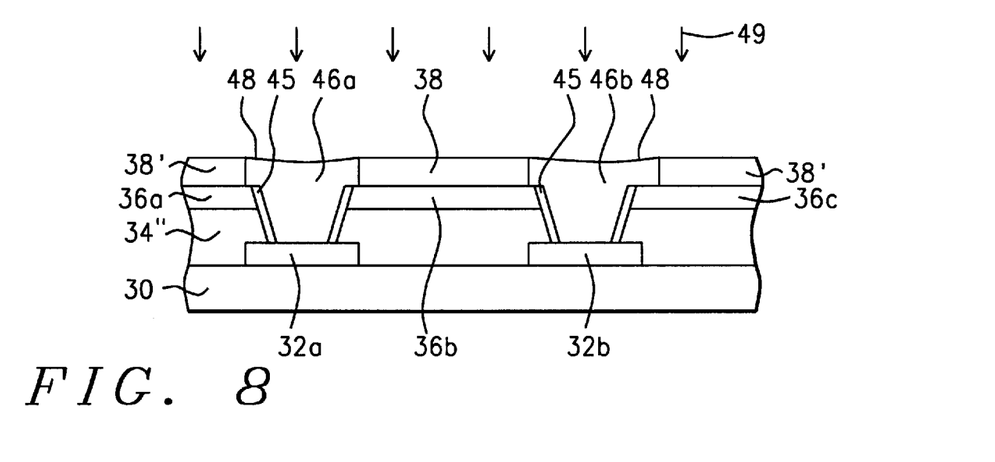

Referring now to FIG. 8, there is shown a schematic cross-sectional diagram illustrating the final results of further processing of the microelectronics integrated circuit fabrication whose schematic cross-sectional diagram is shown in FIG. 7. Shown in FIG. 8 is a microelectronics integrated circuit fabrication otherwise equivalent to the microelectronics integrated circuit fabrication shown in FIG. 7, but wherein there has been etched away through the openings in the photoresist mask pattern 42 and the openings 37 in the silicon nitride pattern 36 the exposed portions of the blanket first dielectric layer 34' and the blanket second dielectric layer 38, followed by stripping of the photoresist mask pattern 40 and subsequent filling of the openings 46 with a barrier layer 45 and conductive studs 48. The various microelectronics fabrication processing steps are performed in a thermal environment 49.

With respect to the etching of the blanket second dielectric layer 38 and blanket first dielectric layer 3 to for the openings 46a and 46b, the etching is performed employing plasma enhanced gas-phase etching of organic polymer dielectric materials as are conventional in the art of microelectronics integrated circuit fabrication. The stripping of the photoresist mask pattern layer 40 is performed employing conventional methods as are known in the art of microelectronics integrated circuit fabrication.

With respect to the barrier layer 45, the barrier layer 45 is preferably formed of tantalum nitride (TaN) deposited employing physical vapor deposition (PVD) sputtering over a seed layer of copper formed by electroplating. Alternatively, the barrier layer 45 may be formed of titanium/titanium nitride (Ti/TiN) employing the method of physical vapor deposition (PVD) sputtering. The conductive studs 48 formed in the openings 46 are preferably formed of copper or aluminum formed respectively employing the methods of electroplating or physical vapor deposition (PVD) sputtering, Upon completion of the microelectronics integrated circuit fabrication of the preferred second embodiment of the present invention, there is obtained a type of structure referred to as a "damascene" structure useful in the manufacture of microelectronics integrated circuit fabrication, Although not shown in FIGS. 4–8, the silicon semiconductor substrate 30 may contain other integrated circuit devices, structures and features as, for example, field effect transistor (FET) devices and circuits. The second dielectric layer 38' serves as an inter-level metal dielectric (IMD) layer in the microelectronics integrated circuit fabrication illustrated in FIG. 8.

EXAMPLES

The thermal annealing of low dielectric constant spin-on-polymer (SOP) dielectric materials employed as dielectric layers at temperatures lower than the first thermal annealing temperature of said dielectric layers is beneficial in attenuating subsequent changes of physical and chemical properties. This was demonstrated by experimental samples fabricated in accord with the method of the present invention wherein the capacitance of dielectric layers of the low dielectric constant spin-on-polymer (SOP) dielectric material known as Flare 2.0 supplied by Allied Signal Corporation was measured for various first and second thermal annealing temperatures. The results are shown in Table I:

TABLE I

Normalized Capacitance for Flare 2.0
Spin-on-polymer (SOP) Low k Dielectric Layer

| Cure Temp. | Capacitance, as 1$^{st}$ annealed 400–450 deg C. | Capacitance, 2$^{nd}$ anneal 2x 60 min, 410 deg C. | Capacitance, 2$^{nd}$ anneal 2x 60 min, 450 deg C. |
| --- | --- | --- | --- |
| 425 | 0.78–0.81 | 0.81 | 0.81 |
| 440 | 0.78–0.80 | 0.78 | 0.79 |

The results of Table I show that thermal annealing for two cycles at temperatures at or below the first thermal annealing temperature of the dielectric layer do not result in significant change in the capacitance and hence the dielectric constant has been stabilized with respect to the annealing steps.

Figure 9:
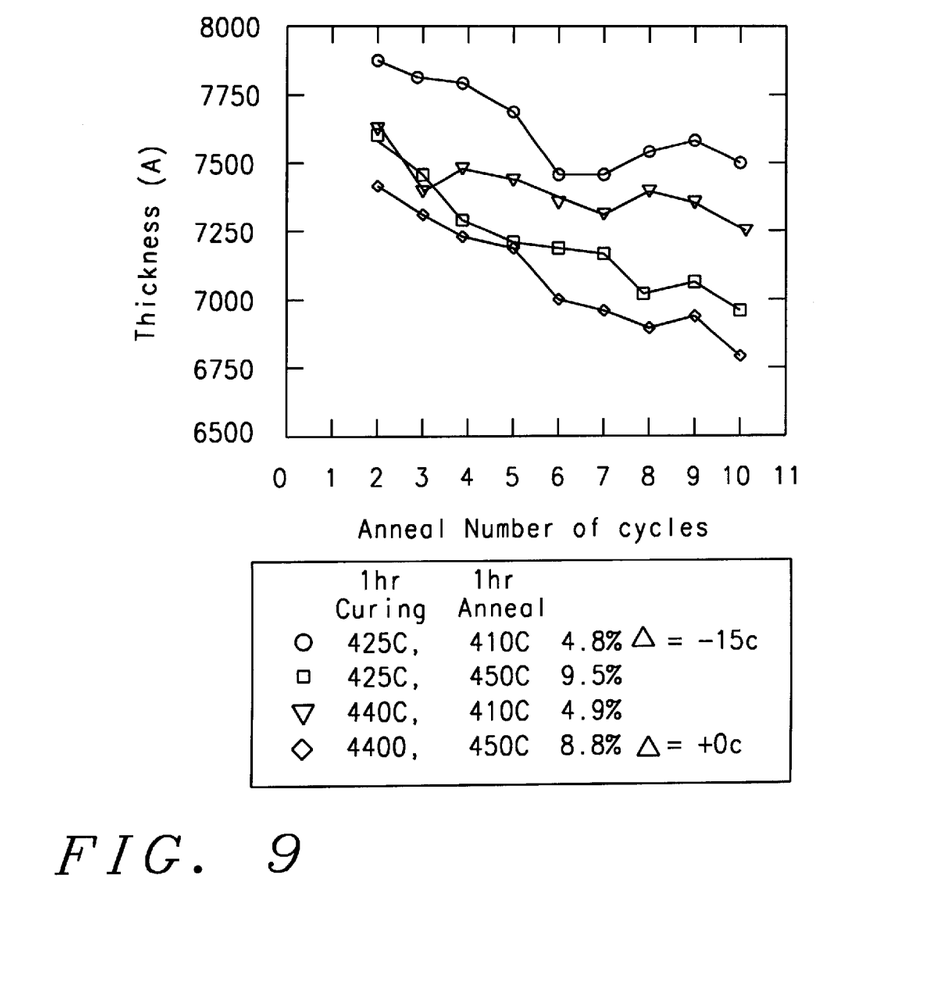
FIG. 9 is a graph showing the thickness of poly (arylene ether) dielectric layers after a number of annealing cycles at various combinations of first and second thermal annealing temperatures.

Further evidence for the efficacy of the method of the present invention is shown in FIG. 9, which is a graph of the measured thickness of the dielectric layers formed employing the low dielectric constant spin-on-polymer (SOP) dielectric material known as Flare 2.0 supplied by Allied Signal Corporation. The data shown in FIG. 9 show the measured thickness of various dielectric layers first thermally annealed at various temperatures and then subjected to a number of second thermal annealing temperature cycles. The greatest stability as manifest by attenuated shrinkage is for the sample first thermally annealed at 440 degrees centigrade and subsequently thermally annealed repeatedly at 410 degrees centigrade. No significant change for that sample is observed even after nine second thermal annealing cycles.

The attenuation of changes in physical and chemical changes caused by subsequent thermal annealing at lower temperatures after thermal annealing is attributed to the insufficiency of the lower second annealing temperatures to supply the thermal activation energies necessary to bring about chemical reactions or rearrangements of the molecular structure of the low dielectric constant dielectric layer formed from the spin-on-polymer (SOP) dielectric material. In order that the subsequent thermal annealing resulting from processing or other thermal requirements, the thermal annealing of dielectric layers which are formed subsequent to the first dielectric layer as exemplified in the second preferred embodiment of the present invention may be carried at a temperature lower than the conventional first thermal annealing or "cure" temperature for a longer time interval to bring about the same initial condition as the "cure" process.

As is understood by a person skilled in the art, the preferred embodiments of the present invention are illustrative of the present invention rather than limiting of the present invention. Revisions and modifications may be made to materials, structures and dimensions through which is provided the preferred embodiments of the present invention while still providing embodiments which are within the spirit and scope of the present invention, as defined by the appended claims.

What is claimed is:

1. A method for forming upon a semiconductor substrate within an integrated circuit microelectronics fabrication a low dielectric constant dielectric layer comprising:

providing a semiconductor substrate;

forming over the semiconductor substrate a patterned microelectronics conductive layer;

forming over the semiconductor substrate and covering the patterned microelectronics layer a blanket first dielectric layer formed employing an organic polymer spin-on-polymer (SOP) low dielectric constant dielectric material whose dielectric constant is from about 2.5 to about 3.0;

annealing the blanket first dielectric layer for a first time interval at a first temperature of about 400 degrees centigrade;

forming a via contact hole dielectric etching mask layer upon the first dielectric layer;

forming a blanket second dielectric layer over the semiconductor substrate;

annealing the blanket second dielectric layer for a second time interval at a second temperature lower than the first annealing temperature of the blanket first dielectric layer;

forming a via contact hole etching mask layer upon the blanket second dielectric layer and etching a via hole pattern through the blanket second and first dielectric layers to form a through via hole pattern to the patterned microelectronics conductor layer; and forming a conductive barrier layer and via stud patterned upper conductor layer upon and within the semiconductor substrate.

2. The method of claim 1 wherein the second annealing temperature of each dielectric layer is selected to be lower than the first annealing temperature so as to attenuate shrinkage and stabilize physical and chemical properties.

3. The method of claim 1 wherein the annealing temperature of the second or succeeding low dielectric constant dielectric layer is lower than the annealing temperature of the previously formed low dielectric constant dielectric layer which constitutes the annealing temperature of said previously formed dielectric layer.

4. The method of claim 1 wherein the annealing treatment time interval is selected so as to lengthen it by about 10 to about 20 minutes as the annealing temperature is lowered by about 10 to about 20 degrees centigrade.

5. The method of claim 4 wherein the organic polymer spin-on-polymer (SOP) low dielectric constant dielectric material is a poly (arylene ether) organic polymer.

6. The method of claim 1 wherein the first annealing temperature of the first blanket low dielectric constant dielectric layer is from about 430 to about 450 degrees centigrade and the first annealing time is from about 20 to about 40 minutes.

7. The method of claim 1 wherein the semiconductor substrate is a silicon substrate.

8. The method of claim 6 wherein the dielectric etch mask layer is a silicon nitride layer formed employing chemical vapor deposition (CVD).

9. The method of claim 1 wherein the patterned barrier conductor layers and via studs are formed from microelectronics materials selected from the group comprising:

microelectronics metallic conductor materials;

microelectronics alloy conductor materials;

microelectronics compound conductor materials; and microelectronics semiconductor materials.

* * * * *

UNITED STATES PATENT AND TRADEMARK OFFICE
CERTIFICATE OF CORRECTION

PATENT NO.    : 6,495,478 B1
DATED         : December 17, 2002
INVENTOR(S)   : Syun-Ming Jang It is certified that error appears in the above-identified patent and that said Letters Patent is hereby corrected as shown below:

<u>Title page,</u>
Item [74], delete "Stephen B. AcKerman", and replace with -- Stephen B. Ackerman --.

Signed and Sealed this

Twentieth Day of May, 2003

JAMES E. ROGAN
*Director of the United States Patent and Trademark Office*